United States Patent
Inazuki et al.

(10) Patent No.: US 7,179,567 B2
(45) Date of Patent: Feb. 20, 2007

(54) PHASE SHIFT MASK BLANK, PHASE SHIFT MASK, AND METHOD OF MANUFACTURE

(75) Inventors: Yukio Inazuki, Niigata-ken (JP); Masayuki Nakatsu, Niigata-ken (JP); Tsuneo Numanami, Niigata-ken (JP); Atsushi Tajika, Niigata-ken (JP); Hideo Kaneko, Niigata-ken (JP); Satoshi Okazaki, Niigata-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 238 days.

(21) Appl. No.: 10/606,894

(22) Filed: Jun. 27, 2003

(65) Prior Publication Data

US 2003/0235767 A1    Dec. 25, 2003

Related U.S. Application Data

(62) Division of application No. 10/212,113, filed on Aug. 6, 2002, now abandoned.

(30) Foreign Application Priority Data

Aug. 6, 2001   (JP)   ............................... 2001-237670

(51) Int. Cl.
  *G03F 1/00*   (2006.01)
(52) U.S. Cl. .......................................................... 430/5
(58) Field of Classification Search ................... 430/5; 427/547; 438/623; 134/1.3, 2
  See application file for complete search history.

(56) References Cited

U.S. PATENT DOCUMENTS

| 5,691,090 A | 11/1997 | Isao et al. |
| 5,858,582 A | 1/1999 | Mitsui |
| 5,907,393 A | 5/1999 | Kawano et al. |
| 5,952,128 A | 9/1999 | Isao et al. |
| 6,037,083 A | 3/2000 | Mitsui |
| 6,127,279 A * | 10/2000 | Konuma ..................... 438/745 |
| 6,242,138 B1 | 6/2001 | Mitsui et al. |
| 6,387,804 B1 * | 5/2002 | Foster ......................... 438/682 |
| 6,436,732 B2 * | 8/2002 | Ahmad ........................ 438/118 |
| 6,635,562 B2 * | 10/2003 | Andreas ...................... 438/633 |
| 6,653,027 B2 * | 11/2003 | Angelopoulos et al. ......... 430/5 |
| 6,667,135 B2 * | 12/2003 | Tanaka et al. ................. 430/5 |
| 2001/0044052 A1 | 11/2001 | Tanabe |
| 2002/0009653 A1 * | 1/2002 | Kawada et al. ................ 430/5 |
| 2002/0039689 A1 | 4/2002 | Yusa et al. |
| 2003/0003616 A1 * | 1/2003 | Ikuta ........................... 438/30 |

FOREIGN PATENT DOCUMENTS

| JP | 7-140635 A | 6/1996 |
| JP | 08-220731 | 8/1996 |
| JP | 10/104813 | 4/1998 |
| JP | 11-84624 | 3/1999 |
| JP | 2001-028358 | 1/2001 |

* cited by examiner

*Primary Examiner*—S. Rosasco
(74) *Attorney, Agent, or Firm*—Birch, Stewart, Kolasch & Birch, LLP

(57) ABSTRACT

In a phase shift mask blank comprising a transparent substrate and a phase shift film thereon, after the phase shift film is formed on the substrate, it is surface treated with ozone water having an ozone concentration of at least 1 ppm. The resulting phase shift film is of quality in that it experiences minimized changes of phase difference and transmittance upon immersion in chemical liquid during subsequent mask cleaning step or the like.

15 Claims, 4 Drawing Sheets

PHASE SHIFT MASK BLANK, PHASE SHIFT MASK, AND METHOD OF MANUFACTURE

This application is a divisional of application Ser. No. 10/212,113, filed on Aug. 6, 2002 now abandoned, the entire contents of which are hereby incorporated by reference and for which priority is claimed under 35 U.S.C. § 120; and this application claims priority of Application No. 2001-237670 filed in JAPAN on Aug. 6, 2001 under 35 U.S.C. § 119.

BACKGROUND OF THE INVENTION

1. Field of the Invention

The present invention relates to phase shift mask blanks and phase shift masks suitable for use in the microfabrication of electronic products such as semiconductor integrated circuits. It relates also to methods of manufacturing such phase shift mask blanks and phase shift masks. More particularly, it relates to halftone phase shift mask blanks and phase shift masks which can attenuate the intensity of exposure wavelength light with a phase shift film, and to methods of manufacturing such phase shift mask blanks and phase shift masks.

2. Prior Art

Photomasks are used in a broad range of applications, including the manufacture of semiconductor integrated circuit (IC), large-scale integration (LSI) and VLSI chips. They are basically constructed by starting with a photomask blank comprising a transparent substrate and a light-shielding film made primarily of chromium thereon and processing the light-shielding film by photolithography using UV radiation or electron beams for thereby forming a desired pattern in the film. The market demand for ever higher levels of integration in semiconductor integrated circuits has led to a rapid reduction in the minimum feature size of photomask patterns. Such miniaturization has been achieved in part by the use of shorter wavelength exposure light.

Although exposure using shorter wavelength light does improve resolution, it has undesirable effects, such as reducing the focal depth, lowering process stability and adversely impacting product yield.

One pattern transfer technique that has been effective for resolving such problems is phase shifting. This involves the use of a phase shift mask as the mask for transferring microscopic circuit patterns.

As shown in accompanying FIGS. 7A and 7B, a phase shift mask (typically, halftone phase shift mask) is generally composed of a substrate 1 on which a phase shift film 2 has been patterned. The mask has both exposed substrate areas (first light-transmitting areas) 1a on which there is no phase shift film, and phase shifters (second light-transmitting areas) 2a that form a pattern region on the mask. The phase shift mask improves the contrast of a transferred image by providing, as shown in FIG. 7B, a phase difference of 180 degrees between light passing through the pattern region and light passing through the non-pattern region, and utilizing the destructive interference of light at the boundary regions of the pattern to set the light intensity in the areas of interference to zero. The use of phase shifting also makes it possible to increase the focal depth at the necessary resolution. Hence, compared with a conventional mask having an ordinary light-shielding pattern such as chromium film, the phase shift mask can improve resolution and increase the margin of the exposure process.

For practical purposes, such phase shift masks can be broadly categorized, according to the light-transmitting characteristics of the phase shifter, as either completely transmitting phase shift masks or halftone phase shift masks. Completely transmitting phase shift masks are masks in which the phase shifter has the same light transmittance as the substrate, and which are thus transparent to light at the exposure wavelength. In halftone phase shift masks, the phase shifter has a light transmittance that ranges from about several percent to several tens of percent the transmittance of exposed substrate areas.

Accompanying FIG. 1 shows the basic structure of a halftone phase shift mask blank, and FIG. 2 shows the basic structure of a halftone phase shift mask. The halftone phase shift mask blank shown in FIG. 1 includes a transparent substrate 1 and a halftone phase shift film 2 formed over the substantially entire surface of the substrate 1. The halftone phase shift mask shown in FIG. 2 is arrived at by patterning the phase shift film 2 of the blank and includes phase shifters 2a which form the pattern regions of the mask and exposed substrate areas 1a on which there is no phase shift film. Exposure light that has passed through the phase shifter 2a is phase-shifted relative to exposure light that has passed through the exposed substrate area 1a (see FIGS. 7A and 7B). The transmittance of the phase shifter 2a is selected such that exposure light which has passed through the phase shifter 2a has too low an intensity to sensitize the resist on the substrate to which the pattern is being transferred. Accordingly, the phase shifter 2a functions to substantially shield out the exposure light.

Halftone phase shift masks of the above type encompass halftone phase shift masks of the single-layer type which are simple in structure and easy to manufacture. Single-layer halftone phase shift masks known to the art include those described in JP-A 7-140635 which have a phase shifting film composed of a molybdenum silicide material such as MoSiO or MoSiON.

One important feature for these phase shift masks and phase shift mask blanks is resistance to acids, for example, chemical liquids such as sulfuric acid and aqueous persulfuric acid (mixture of sulfuric acid and aqueous hydrogen peroxide) used in the resist removing and cleaning steps of the mask manufacture process, and chromium etchants having a high oxidizing power used in removal of chromium film.

Prior art phase shift films are less resistant to chemical liquids and raise a problem that the cleaning or chromium etching step results in deviations of phase difference and transmittance from the preset values.

SUMMARY OF THE INVENTION

It is therefore an object of the invention to provide phase shift mask blanks and phase shift masks of quality which experience little changes of phase difference and transmittance under the action of chemical liquids used for cleaning. Another object of the invention is to provide methods of manufacturing such phase shift mask blanks and phase shift masks.

The invention addresses a phase shift mask blank comprising a substrate which is transparent to exposure wavelength and at least one layer of phase shift film thereon. It has been found that once the phase shift film is formed, it is surface treated with ozone water having at least 1 ppm of ozone dissolved therein whereby the surface of the phase shift film is modified such that the phase shift film will experience little changes of phase difference and transmittance when later treated with chemical liquids in cleaning and chromium etching steps. The resulting phase shift mask blank is of high quality in this sense, and a phase shift mask obtained therefrom is as well.

In a first aspect, the present invention provides a phase shift mask blank comprising a transparent substrate and at least one layer of phase shift film thereon. In a first embodiment, the phase shift film has been surface treated with ozone water having at least 1 ppm of ozone dissolved therein. In a second embodiment, the phase shift film is formed of a metal silicide oxide, metal silicide nitride or metal silicide oxynitride and then surface treated with ozone water having at least 1 ppm of ozone dissolved therein. In a third embodiment, the phase shift film is formed of molybdenum silicide oxide, molybdenum silicide nitride or molybdenum silicide oxynitride and then surface treated with ozone water having at least 1 ppm of ozone dissolved therein.

Preferably, the phase shift film has an oxygen content and a silicon content at its surface, and a molar ratio of the oxygen content to the silicon content is at least 1. Also preferably, the phase shift film changes the phase of exposure light passing therethrough by 180±5 degrees and has a transmittance of 3 to 40%.

In a second aspect, the present invention provides a phase shift mask obtained by patterning the phase shift film in the inventive phase shift mask blank.

In a third aspect, the present invention provides a method of manufacturing a phase shift mask blank comprising a transparent substrate and at least one layer of phase shift film thereon. In a first embodiment, the method includes the steps of forming the phase shift film on the substrate and surface treating the phase shift film with ozone water having at least 1 ppm of ozone dissolved therein. In a second embodiment, the method includes the steps of forming the phase shift film of a metal silicide oxide, metal silicide nitride or metal silicide oxynitride on the substrate and surface treating the phase shift film with ozone water having at least 1 ppm of ozone dissolved therein. In a third embodiment, the method includes the steps of forming the phase shift film of molybdenum silicide oxide, molybdenum silicide nitride or molybdenum silicide oxynitride on the substrate and surface treating the phase shift film with ozone water having at least 1 ppm of ozone dissolved therein.

In a fourth aspect, the present invention provides a method of manufacturing a phase shift mask, comprising the steps of forming by photolithography a patterned resist film on the phase shift film in the phase shift mask blank obtained by the above method, etching away the portions of the phase shift mask which are uncovered with the resist film, and thereafter, removing the resist film.

According to the invention, once the phase shift film is formed, it is surface treated with ozone water having at least 1 ppm of ozone dissolved therein whereby the outermost surface of the film is uniformly oxidized such that the phase shift film will experience little changes of phase difference and transmittance when later treated with chemical liquids such as aqueous persulfuric acid in the mask manufacturing process.

BRIEF DESCRIPTION OF THE DRAWINGS

The objects, features and advantages of the invention will become more apparent from the following detailed description, taken in conjunction with the accompanying drawings.

FIG. 6A shows a mask blank on which a resist film has been formed, FIG. 6B shows the structure after the resist film has been patterned, FIG. 6C shows the structure after etching has been carried out, and FIG. 6D shows the completed mask after the resist film has been removed.

FIG. 7B is an enlarged view of region X in FIG. 7A.

DETAILED DESCRIPTION OF THE INVENTION

Figure 1:
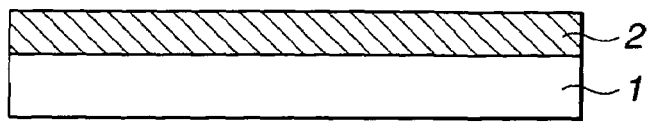
FIG. 1 is a sectional view of a phase shift mask blank according to one embodiment of the invention.
Figure 2:
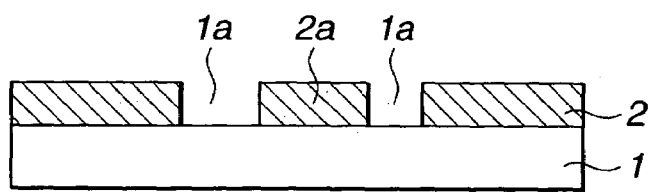
FIG. 2 is a sectional view of a phase shift mask made from the same blank.

Referring to FIG. 1, a phase shift mask blank according to the invention includes a substrate 1 of quartz, $CaF_2$ or the like which is transparent to exposure light and at least one layer of phase shift film 2. After the phase shift film 2 is formed on the substrate 1, it is surface treated with ozone water having at least 1 ppm of ozone dissolved therein. The phase shift mask of the invention is obtained by patterning the phase shift film 2 of the phase shift mask blank shown in FIG. 1. The mask has patterned phase shifters 2 as shown in FIG. 2, wherein first light-transmitting areas (exposed substrate areas) 1a are defined between the patterned phase shifters and second light-transmitting areas 2a are provided by the patterned phase shifters.

The phase shift film is preferably formed of a metal silicide oxide, metal silicide nitride or metal silicide oxynitride, and more preferably molybdenum silicide oxide (MoSiO), molybdenum silicide nitride (MoSiN) or molybdenum silicide oxynitride (MoSiON).

For depositing the phase shift film, a reactive sputtering technique is preferred. When a metal silicide oxide, metal silicide nitride or metal silicide oxynitride is to be deposited, the target used in sputtering is a metal silicide target containing that metal. When molybdenum silicide oxide, molybdenum silicide nitride or molybdenum silicide oxynitride is to be deposited, a molybdenum silicide target is used. To maintain a constant film composition, a metal silicide having either one or both of oxygen and nitrogen added thereto may be used.

The sputtering process may employ a direct-current power supply (DC sputtering) or a high-frequency power supply (RF sputtering). Either a magnetron sputtering system or a conventional sputtering system may be used. The film-forming system may be either a continuous, in-line system or a single-wafer processing system.

The sputtering gas may contain an inert gas such as argon or xenon, nitrogen gas, oxygen gas and various nitrogen oxide gases, which are suitably combined so that the phase shift film deposited therefrom may have a desired composition.

Where it is desired to increase the transmittance of a phase shift film to be deposited, it is recommended that the amounts of oxygen and nitrogen-containing gases in the sputtering gas be increased so that more oxygen and nitrogen are taken into the film, or a metal silicide having more oxygen and nitrogen previously added thereto be used as the sputtering target.

In the phase shift mask blank of the invention, the phase shift film may include a plurality of layers.

According to the invention, after the phase shift film is formed on the substrate, it is surface treated with ozone water. The ozone water used herein should preferably have an ozone concentration of at least 1 ppm, more preferably at least 5 ppm. The upper limit of the ozone concentration is not critical and may be ozone saturation level. Specifically, the ozone concentration is often up to 50 ppm, and especially up to 20 ppm. The ozone treatment may be carried out by immersing the phase shift mask blank in a tank full of ozone water, or by flowing ozone water over the phase shift mask blank while spinning the blank. The treatment temperature may be in the range of 0 to 60° C., especially 0 to 30° C. although room temperature is most often used. The treatment time may be suitably determined and is preferably about 1 to 10 minutes, especially about 2 to 5 minutes.

Preferably, the phase shift film has an oxygen content and a silicon content at its surface, and a molar ratio of the oxygen content to the silicon content is at least 1 and more preferably between 1 and 2.

By the action of ozone water, the outermost surface of the phase shift film is oxidized and stabilized so that it will experience little changes of phase difference and transmittance when later contacted with chemical liquids such as sulfuric acid.

In summary, the phase shift mask blank of the invention includes a transparent substrate and at least one layer of phase shift film which is deposited thereon, preferably by a reactive sputtering technique using a sputtering gas containing oxygen and/or nitrogen and then treated with ozone water containing at least 1 ppm of ozone, which ensures that the phase shift film has a transmittance of several percent to several tens of percent, especially 3 to 40% to exposure light and the resulting phase shift mask provides a phase difference of 180°±5° between light transmitted by the phase shifter and light transmitted by the transparent substrate.

Figure 3:
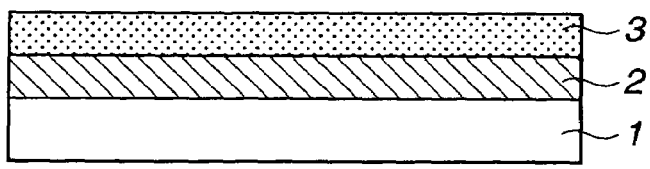
FIG. 3 is a sectional view of a phase shift mask blank having a Cr base light-shielding film according to another embodiment of the invention.
Figure 4:
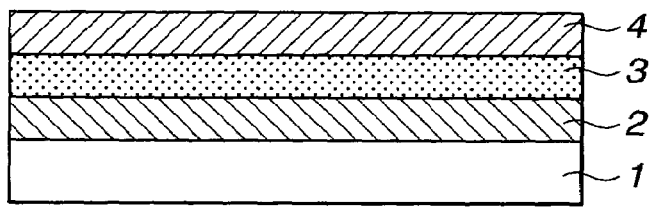
FIG. 4 is a sectional view of a phase shift mask blank having a Cr base light-shielding film and a Cr base antireflection film according to a further embodiment of the invention.
Figure 5:
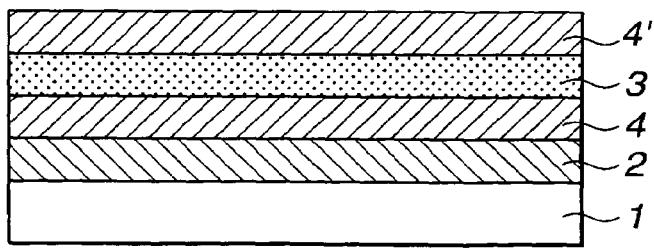
FIG. 5 is a sectional view of a phase shift mask blank according to a still further embodiment of the invention.

In another embodiment, the phase shift mask blank of the invention may include a chromium-base light-shielding film 3 which is formed on the phase shift film 2 (which has been surface treated with ozone water) as shown in FIG. 3. In a further embodiment, as shown in FIG. 4, a chromium-base antireflection film 4 may be formed on the chromium-base light-shielding film 3 for reducing reflection from the chromium-base light-shielding film 3. In a still further embodiment, as shown in FIG. 5, a phase shift film 2, a first Cr base antireflection film 4, a Cr base light-shielding film 3, and a second Cr base antireflection film 4' are formed on the substrate 1 in order.

Figure 6A:
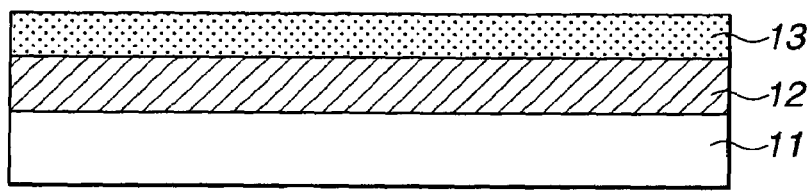
FIGS. 6A to 6D are sectional views illustrating the method of manufacturing a phase shift mask from a phase shift mask blank according to the invention.
Figure 6B:
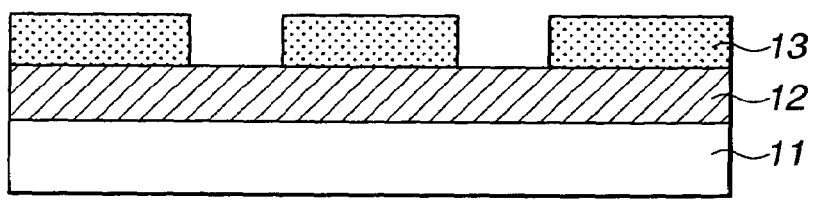
Figure 6C:
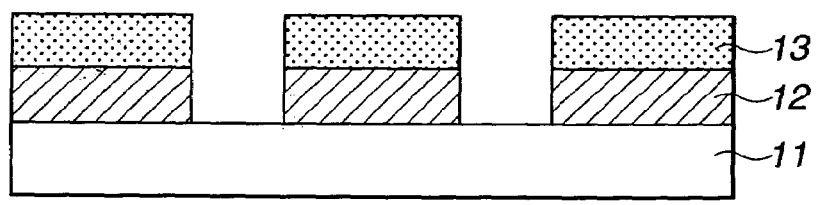
Figure 6D:
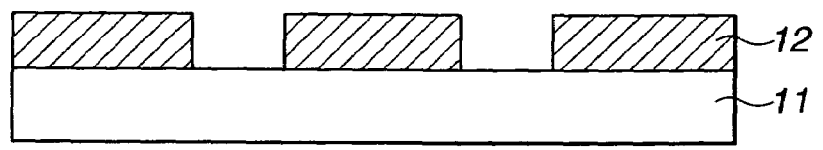
Figure 7A:
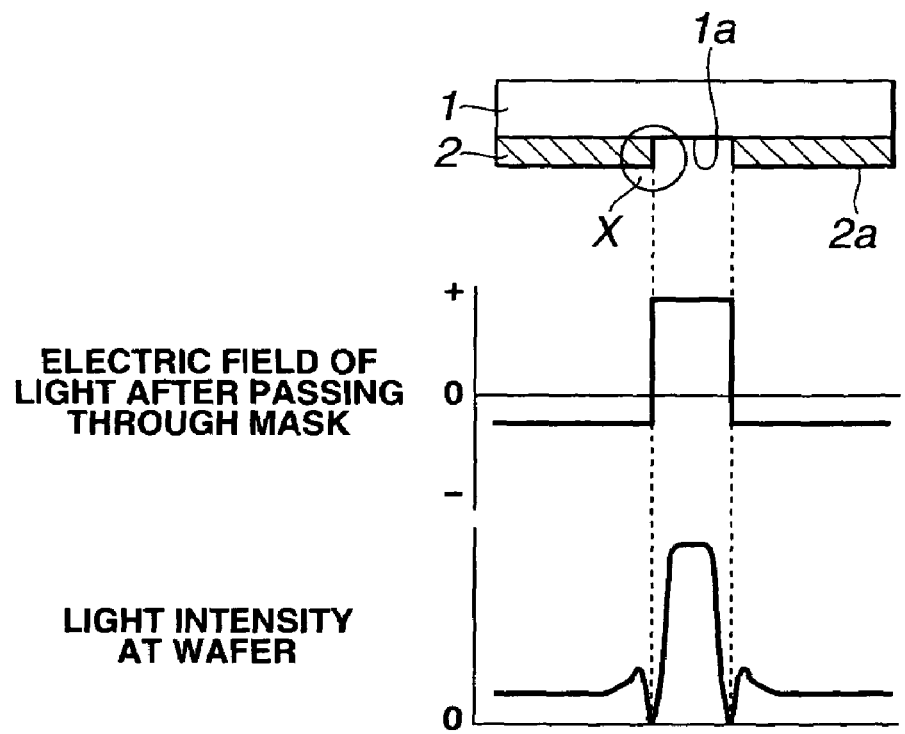
FIGS. 7A and 7B illustrate the operating principle of a halftone phase shift mask.
Figure 7B:
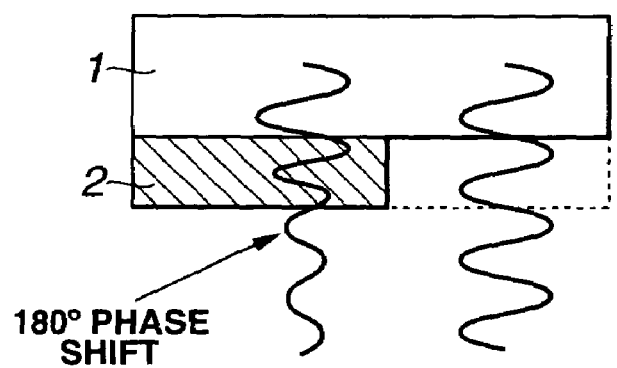

By patterning the phase shift film of the phase shift mask blank according to the invention, a phase shift mask as shown in FIG. 2 is manufactured. A typical process is shown in FIG. 6. After a phase shift film 12 is formed on a transparent substrate 11 and surface treated with ozone water containing at least 1 ppm of ozone, a resist film 13 is formed on the phase shift film 12 (FIG. 6A). Next, the resist film 13 is lithographically patterned (FIG. 6B), after which the phase shift film 12 is etched (FIG. 6C). The resist film 13 is subsequently stripped (FIG. 6D). In this process, application of the resist film, patterning (exposure and development), etching and resist film removal may be carried out by known techniques.

EXAMPLE

Examples and comparative examples are given below by way of illustration, and are not intended to limit the scope of the invention.

Example 1

A molybdenum silicide oxynitride (MoSiON) film of 120 nm thick was deposited on a quartz substrate of 6 inches square by a DC sputtering technique using molybdenum silicide as the sputtering target and a gas mixture of argon, nitrogen and oxygen in a flow ratio of 1:15:1 as the sputtering gas at a discharge power of 200 W, and a deposition temperature of 200° C. The phase shift film as deposited had a phase difference of 185.4° and a transmittance of 5.62%.

Using a spin washer, the sample was treated for 5 minutes with ozone water having an ozone concentration of 18 ppm at room temperature and then spin dried. The ozone-treated phase shift film had a phase difference of 184.6° and a transmittance of 5.82%.

The sample was immersed in a chemical liquid which was a 1:4 mixture of sulfuric acid and aqueous hydrogen peroxide at 80° C. for 2 hours. The sample was measured for phase difference and transmittance again, and its chemical resistance was evaluated from changes of phase difference and transmittance before and after the chemical immersion.

The sample after 2 hours of immersion in chemical liquid had a phase difference of 182.1° and a transmittance of 6.50%. By the chemical immersion, the phase difference changed −2.5° and the transmittance changed +0.68%. The results are shown in Table 1.

It is noted that the phase difference and transmittance were measured by MPM-248 by Laser Tec Co. at a wavelength of 248 nm.

Figure 8:
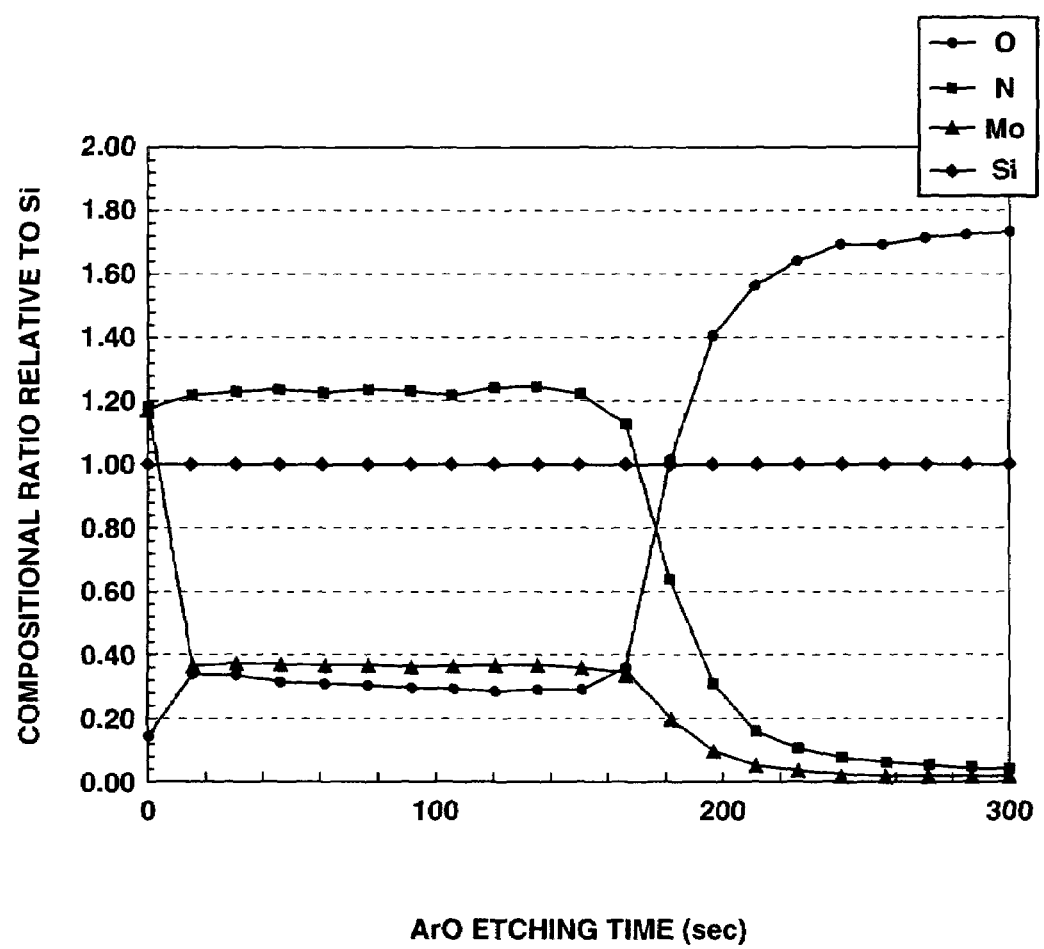
FIG. 8 is a diagram showing the composition in depth direction of a phase shift film as analyzed by ESCA.

The composition of the sample after ozone water treatment was analyzed in a depth direction by ESCA. The results are shown in FIG. 8, which indicates that the oxygen content within the film has a molar ratio of about 0.3 to the silicon content whereas the oxygen content at the outermost surface has a molar ratio of 1.2 to the silicon content.

Comparative Example 1

A molybdenum silicide oxynitride (MoSiON) film of 118 nm thick was deposited as in Example 1. The phase shift film as deposited had a phase difference of 178.8° and a transmittance of 6.09%.

The sample was tested for chemical resistance as in Example 1. The sample after 2 hours of immersion in chemical liquid had a phase difference of 173.9° and a transmittance of 7.61%. By the chemical immersion, the phase difference changed −4.9° and the transmittance changed +1.52%. The results are also shown in Table 1.

It is noted that the measurement of phase difference and transmittance is the same as in Example 1.

TABLE 1

|  |  | Chemical resistance | | |
| --- | --- | --- | --- | --- |
|  |  | Before immersion | After immersion | Change |
| Example 1 | Phase difference | 184.6° | 182.1° | −2.5° |
|  | Transmittance | 5.82% | 6.50% | +0.68% |
| Comparative Example 1 | Phase difference | 178.8° | 173.9° | −4.9° |
|  | Transmittance | 6.09% | 7.61% | +1.52% |

It is evident that the ozone water treatment of the phase shift film after its formation improves the acid resistance of the film so that the resulting phase shift mask blank (and phase shift mask thereof) is of quality in that it experiences minimized changes of phase difference and transmittance upon contact with chemical liquid during subsequent cleaning step.

Although ozone water having an ozone concentration of 18 ppm was used in Example, the invention is not limited thereto. Treatment with ozone water is effective to the purpose of the invention as long as ozone is contained even in a minute amount, specifically at least 1 ppm.

Although a molybdenum silicide oxynitride film was used in Example, the invention is not limited thereto. Equivalent results are obtainable on use of molybdenum silicide oxide or molybdenum silicide nitride. This is also true to phase shift mask blanks and phase shift masks using silicide oxides, silicide nitrides or silicide oxynitrides of metals other than molybdenum as the phase shift film. Moreover, the invention is not limited to those containing phase shift mask blanks and phase shift masks having phase shift films of metal silicides, and equivalent results are obtainable from phase shift mask blanks and phase shift masks having other phase shift films.

There have been described a phase shift mask blank and a phase shift mask thereof in which a phase shift film is formed by a reactive sputtering technique and then treated with ozone water whereby the resulting phase shift film is of quality in that it will experience minimized changes of phase difference and transmittance upon contact with chemical liquid during subsequent mask cleaning step or the like.

Japanese Patent Application No. 2001-237670 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method of manufacturing a phase shift mask blank comprising a transparent substrate and at least one layer of phase shift film thereon, and further comprising a chromium-base light-shielding film being formed on the phase shift film, said method comprising the steps of forming the phase shift film on the substrate, oxidizing an outermost surface of the phase shift film with ozone water having 1 to 50 ppm of ozone dissolved therein, and forming the chromium-base light-shielding film on the phase shift film which has been surface treated with the ozone water.

2. The method of manufacturing a phase shift mask blank of claim 1 wherein said phase shift film changes the phase of exposure light passing therethrough by 180±5 degrees and has a transmittance of 3 to 40%.

3. A method of manufacturing a phase shift mask, comprising the steps of forming by photolithography a patterned resist film on the phase shift film in the phase shift mask blank obtained by the method of claim 1, etching away the portions of the phase shift mask which are uncovered with the resist film, and thereafter, removing the resist film.

4. The method of manufacturing a phase shift mask blank of claim 1, wherein the ozone water has 5 to 50 ppm of ozone dissolved therein.

5. The method of manufacturing a phase shift mask blank of claim 1, wherein said at least one layer of phase shift film is formed on said substrate by a reactive sputtering technique.

6. A method of manufacturing a phase shift mask blank comprising a transparent substrate and at least one layer of phase shift film thereon, and further comprising a chromium-base light-shielding film being formed on the phase shift film, said method comprising the steps of forming the phase shift film of a metal silicide oxide, metal silicide nitride or metal silicide oxynitride on the substrate oxidizing an outermost surface of the phase shift film with ozone water having 1 to 50 ppm of ozone dissolved therein, and forming the chromium-base light-shielding film on the phase shift film which has been surface treated with the ozone water.

7. The method of manufacturing a phase shift mask blank of claim 6, wherein the ozone water has 5 to 50 ppm of ozone dissolved therein.

8. The method of manufacturing a phase shift mask blank of claim 6, wherein said phase shift film changes the phase of exposure light passing therethrough by 180±5 degrees and has a transmittance of 3 to 40%.

9. A method of manufacturing a phase shift mask, comprising the steps of forming by photolithography a patterned resist film on the phase shift film in the phase shift mask blank obtained by the method of claim 6, etching away the portions of the phase shift mask which are uncovered with the resist film, and thereafter, removing the resist film.

10. The method of manufacturing a phase shift mask blank of claim 6, wherein said at least one layer of phase shift film is formed on said substrate by a reactive sputtering technique.

11. A method of manufacturing a phase shift mask blank comprising a transparent substrate and at least one layer of phase shift film thereon, and further comprising a chromium-base light-shielding film being formed on the phase shift film, said method comprising the steps of forming the phase shift film of a molybdenum silicide oxide, molybdenum silicide nitride or molybdenum silicide oxynitride on the substrate, oxidizing an outermost of the phase shift film with ozone water having 1 to 50 ppm of ozone dissolved therein, and forming the chromium-base light-shielding film on the phase shift film which has been surface treated with the ozone water.

12. The method of manufacturing a phase shift mask blank of claim 11, wherein the ozone water has 5 to 50 ppm of ozone dissolved therein.

13. The method of manufacturing a phase shift mask blank of claim 11, wherein said phase shift film changes the phase of exposure light passing therethrough by 180±5 degrees and has a transmittance of 3 to 40%.

14. A method of manufacturing a phase shift mask, comprising the steps of forming by photolithography a patterned resist film on the phase shift film in the phase shift mask blank obtained by the method of claim 11, etching away the portions of the phase shift mask which are uncovered with the resist film, and thereafter, removing the resist film.

15. The method of manufacturing a phase shift mask blank of claim 11, wherein said at least one layer of phase shift film is formed on said substrate by a reactive sputtering technique.

* * * * *